(12) United States Patent
Wu et al.

(10) Patent No.: US 6,552,886 B1
(45) Date of Patent: Apr. 22, 2003

(54) ACTIVE VCC-TO-VSS ESD CLAMP WITH HYSTERSIS FOR LOW SUPPLY CHIPS

(75) Inventors: Ke Wu, Fremont, CA (US); David Kwong, Fremont, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 405 days.

(21) Appl. No.: 09/607,458

(22) Filed: Jun. 29, 2000

(51) Int. Cl.$^7$ ................................................ H02H 9/00
(52) U.S. Cl. ......................................................... 361/56
(58) Field of Search ............ 361/56, 111; 257/355–358

(56) References Cited

U.S. PATENT DOCUMENTS

| | | | |
|---|---|---|---|
| 4,692,834 A | 9/1987 | Iwahashi et al. | 361/91 |
| 4,890,187 A | 12/1989 | Tailliet et al. | 361/111 |
| 5,237,395 A | 8/1993 | Lee | 257/359 |
| 5,255,146 A | 10/1993 | Miller | 361/56 |
| 5,530,612 A | 6/1996 | Maloney | 361/56 |
| 5,559,659 A | * 9/1996 | Strauss | 361/56 |
| 5,719,737 A | 2/1998 | Maloney | 361/111 |
| 5,744,842 A | 4/1998 | Ker | 257/362 |
| 5,751,042 A | 5/1998 | Yu | 257/360 |
| 5,838,146 A | 11/1998 | Singer | 323/270 |
| 5,907,464 A | 5/1999 | Maloney et al. | 361/111 |
| 5,910,873 A | 6/1999 | Boluna et al. | 361/56 |
| 5,956,219 A | 9/1999 | Maloney | 361/56 |
| 5,990,723 A | 11/1999 | Tanase | 327/313 |
| 6,008,970 A | 12/1999 | Maloney et al. | 361/56 |

OTHER PUBLICATIONS dabral & Maloney, Basic ESD and I/O Design, John Wiley & Sons, 1998, pp. 61–62 No month.

\* cited by examiner

*Primary Examiner*—Ronald W. Leja
(74) *Attorney, Agent, or Firm*—Stuart T. Auvinen

(57) ABSTRACT

An electro-static-discharge (ESD) protection circuit is coupled between power and ground. It protects core circuits in a semiconductor chip. The ESD protection circuit is an active circuit that drives the gate of an n-channel clamp transistor. The clamp transistor shunts current from power to ground when its gate is driven high during an ESD event. A voltage divider generates a sense voltage that drives a first inverter. The sense voltage is normally much lower than the switch threshold of the first inverter. When an ESD voltage spike occurs, the sense voltage rises above the switch threshold, switching the output of the first inverter. A string of inverters is driven by the first inverter, with a final inverter driving the gate of the clamp transistor. An extending n-channel transistor drives the input of the final inverter low when the clamping transistor is on, extending the discharge time. A hysteresis p-channel transistor drives the output of the first inverter high, delaying turn-on of the clamp transistor. This increases the voltage required to trigger the protection circuit.

20 Claims, 4 Drawing Sheets

US 6,552,886 B1

ACTIVE VCC-TO-VSS ESD CLAMP WITH HYSTERSIS FOR LOW SUPPLY CHIPS

FIELD OF THE INVENTION

This invention relates to semiconductor protection, and more particularly to electro-static-discharge (ESD) protection of core circuitry using dynamic circuits.

BACKGROUND OF THE INVENTION

Semiconductor process technology has produced extremely small transistors. These tiny transistors have thin oxide and insulating layers that can easily be damaged by relatively small currents with even a moderate driving force (voltage). Special care is required when a person handles these semiconductor devices.

Static electricity that normally builds up on a person can discharge across the input pins or a semiconductor integrated circuit (IC or chip). IC chips are routinely tested for resistance to such electro-static-discharges (ESD) using automated testers that apply a voltage across different pairs of pins of the chip. Any pair of pins may be chosen for the ESD test.

While input and output pins were originally provided with ESD-protection circuits, the core circuitry was directly connected to the Vcc power supply and the Vss ground supply. When an ESD pulse was applied between Vcc and Vss, little or no damage was apparent. The large number of transistors connected to the power and ground supplies apparently reduced the current surge in any one device, thus dissipating the ESD pulse using the chip's internal transistors.

However, as device sizes continued to shrink, damage began occurring when ESD pulses were applied between power and ground. The exact failure mechanism could be difficult to determine, and varied from design to design with the circuit and geometry of the integrated circuit (IC). ESD-protection circuits then were provided for power-supply pins. One kind of IC that is sensitive to Vcc-to-Vss ESD pulses is a mixed-signal chip that has several different power supplies. See the related co-pending application for an "Actively-Driven Thin-Oxide MOS Transistor Shunt for ESD Protection of Multiple Independent Supply Busses in a Mixed-Signal Chip" assigned to Pericom Semiconductor, Ser. No. 09/251,722, filed Feb. 17, 1999. However, even single-supply chips can benefit from Vcc-to-Vss protection circuits.

FIG. 1A shows a simplified prior-art ESD protection device using a thick-oxide transistor. Power-supply Vcc and ground Vss are connected by thick-oxide transistor 10, which does not normally conduct so that the supplies are isolated. However, when a high voltage is applied across Vcc and Vss during an ESD event, thick-oxide transistor 10 conducts, either by the high voltage forming a conducting channel under the thick field-oxide under the gate, or by punch-through in the substrate from drain to source in the substrate. Thus core circuitry 12 is protected when thick oxide transistor 10 turns on.

While such thick-oxide transistors are less sensitive to damage than thin-oxide transistors, the amount of current conducted is reduced. A very high gate voltage is needed to turn on the transistor since the channel is separated from the gate by the larger distance of the thick oxide. Damage to other thin-oxide transistors on the chip can occur before the thick-oxide transistor turns on. Thus the protection provided by thick-oxide transistor 10 is less than desired.

FIG. 1B shows a thin-oxide transistor ESD-protection device. Core circuitry 12 is protected by n-channel transistor 14, which uses the same thin oxide as other transistors in core circuitry 12. Since the gate of n-channel transistor 14 is grounded, it does not turn on by channel formation in the normal manner. Instead, when a high voltage is applied across its source and drain terminals, the lateral NPN transistor turns on. FIG. 1C shows a snapback I–V curve for the n-channel transistor of FIG. 1B. When a high voltage is applied, the n-channel transistor turns on, reducing the source-drain voltage while conducting a large current. FIG. 2 shows the lateral NPN transistors in n-channel transistor 14.

A large base-emitter area is required to conduct enough current. A width of 400 microns may be required for transistor 14. Also, if one of the transistors in core circuitry 12 turns on its parasitic lateral transistor before transistor 14, then core circuitry 12 is subjected to the ESD current stress rather than n-channel transistor 14.

FIG. 3 shows an active clamp with an R-C sense for ESD protection. Rather than use passive circuits, such as the simple transistors of FIGS. 1A, 1B, a more complex active circuit can be used to sense the ESD pulse and turn on the clamp transistor. See for example, "Basic ESD and I/O Design" by Dabral and Maloney, pages 61–62.

Core circuitry 12 is protected by clamp transistor 22, which has its gate actively driven by inverter string 20. An R-C sensing element is formed by capacitor 18 and transistor 16, which is a grounded-gate p-channel transistor.

While such an active ESD-protection circuit is useful, it may be susceptible to noise, especially during power-up of the chip. If the active ESD-protection circuit triggers during power-up, excessive current may be drawn through the clamp transistor, resulting in a drop in Vcc or even Latch-up. Low-voltage supplies may be more susceptible since the Vcc ramp is shallower.

What is desired is an ESD-protection circuit that protects the internal power supplies of an IC. An active rather than a passive protection circuit is desired. It is desired to actively enable or disable the ESD-protection circuit. It is desired to actively enable and disable a thin-oxide transistor as an ESD shunt between power and ground busses. It is desired to avoid thick-oxide transistors and diodes. An active ESD-protection circuit that is insensitive to noise during power up is desired.

SUMMARY OF THE INVENTION

A protection circuit has a clamping transistor that is coupled to shunt current from an electro-static-discharge (ESD) pulse. It has a control gate. A voltage divider is coupled to the ESD pulse. It generates a divided voltage that is a predetermined fraction of a voltage of the ESD pulse. A chain of inverters receives the divided voltage. They drive the control gate of the clamping transistor.

An extending transistor drives an extended internal node in the chain of inverters. It has a gate that receives a feedback voltage from another internal node in the chain of inverters after the extended internal node. Thus the extending transistor extends a discharge time that the clamping transistor is shunting current during the ESD pulse.

In further aspects a hysteresis transistor is coupled to drive an output of an inverter in the chain of inverters. It increases a divided voltage required to turn on the control gate of the clamping transistor. Thus a higher turn-on voltage is required.

In further aspects the hysteresis transistor is a transistor that couples a first internal node in the chain of inverters to a power supply. The hysteresis transistor has a gate coupled to a second internal node after the first internal node. The second internal node is driven by an inverter that has the first internal node as an input. Thus hysteresis is provided by coupling to the power supply.

In other aspects the hysteresis transistor is a p-channel transistor while the clamping transistor is an n-channel transistor.

In further aspects the clamping transistor has a drain coupled to a power supply, and a source coupled to a ground. Thus the clamping transistor shunts current from power to ground when the ESD pulse is applied from a power pin to a ground pin. The extending transistor is an n-channel transistor coupled between the extended internal node and the ground. The extending transistor has a gate coupled to the control gate of the clamping transistor. Thus the extending transistor and the clamping transistor share a common gate node.

In still further aspects the chain of inverters includes a first inverter that receives the divided voltage from the voltage divider to output the first internal node, a second inverter that receives the first internal node and outputs the second internal node, a third inverter that receives the second internal node and outputs the extended internal node, and a fourth inverter that receives the extended internal node and drives the control gate of the clamping transistor. Thus four inverters are in the chain of inverters.

In further aspects filter capacitors are coupled to the voltage divider. They capacitivly couple the divided voltage to the ground and to the power supply. Thus the divided voltage is capacitivly coupled to the power supply and to the ground.

DETAILED DESCRIPTION

The present invention relates to an improvement in ESD-protection devices. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that an active circuit can provide more accurate and controllable electro-static-discharge (ESD) protection of core circuitry. The inventors further realize that these active ESD-protection circuits can be quite sensitive to noise on the power supply. Such noise commonly occurs at power up. Thus active ESD-protection circuits should include special circuitry for noise immunity at power-up.

Figure 4:
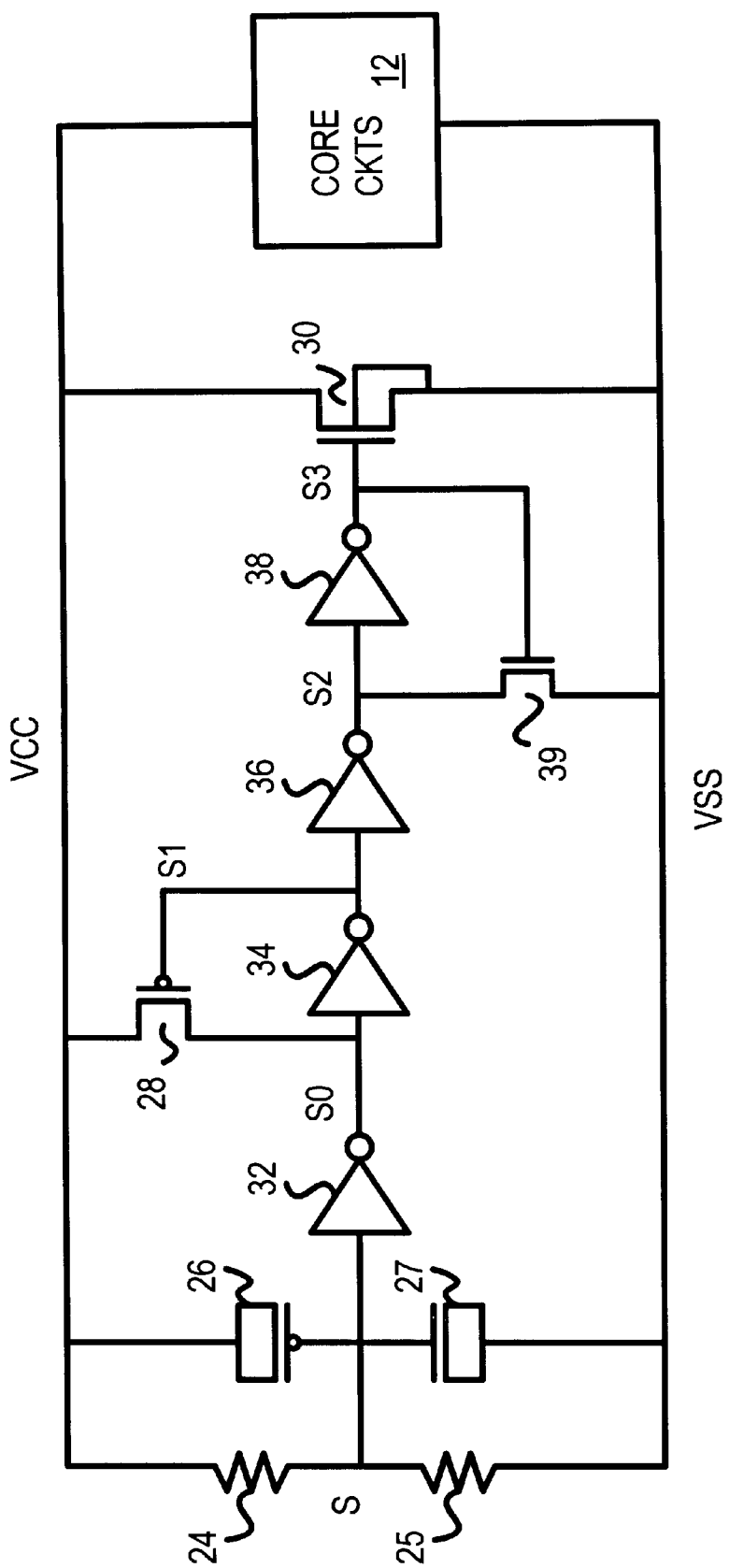
FIG. 4 is a schematic of an improved active ESD-protection circuit.

FIG. 4 is a schematic of an improved active ESD-protection circuit. Clamp transistor 30 is a large n-channel transistor that shunts an ESD pulse from Vcc power to Vss ground. This limits the voltage on Vcc, protecting core circuitry 12. Rather than passively ground the gate of clamp transistor 30, the gate is actively driven by inverter 38, which is the last inverter in a chain of inverters 32, 34, 36, 38.

Figure 1A:
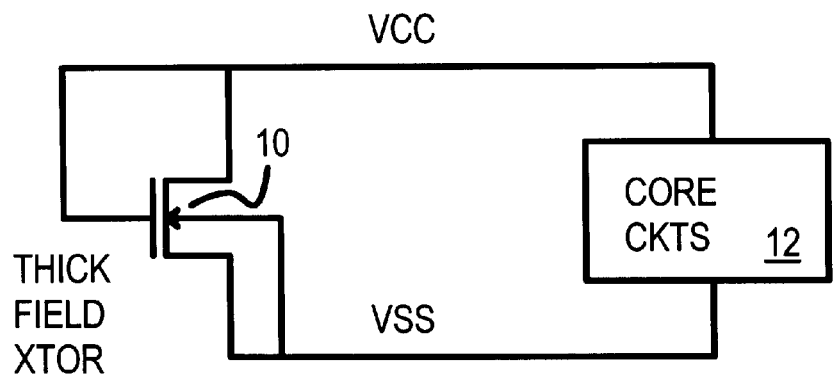
FIG. 1A shows a simplified prior-art ESD protection device using a thick-oxide transistor.
Figure 1B:
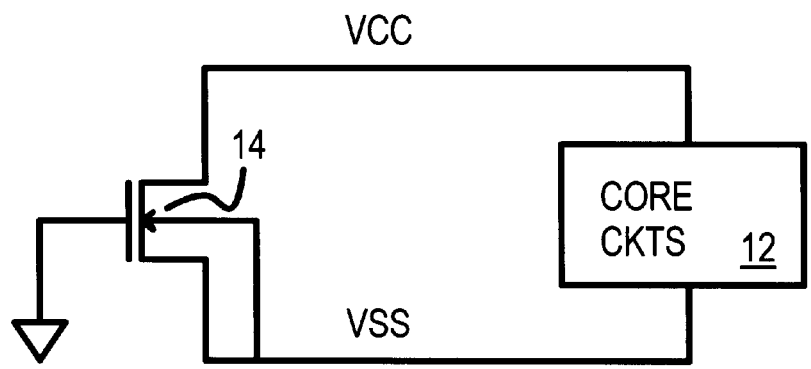
FIG. 1B shows a thin-oxide transistor ESD-protection device.
Figure 1C:
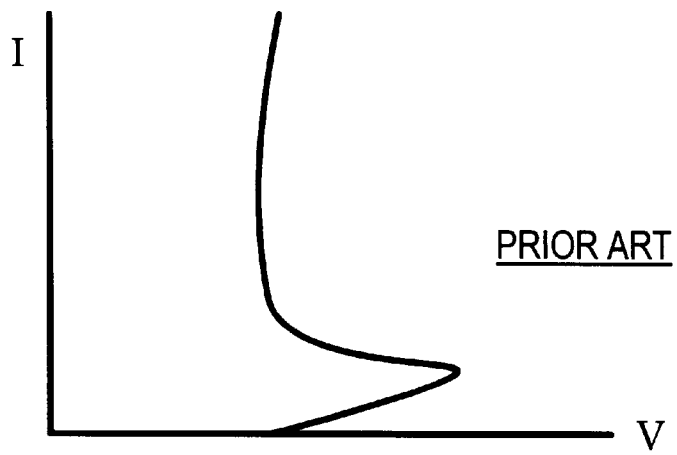
FIG. 1C shows a snapback I-V curve for the n-channel transistor of FIG. 1B.
Figure 2:
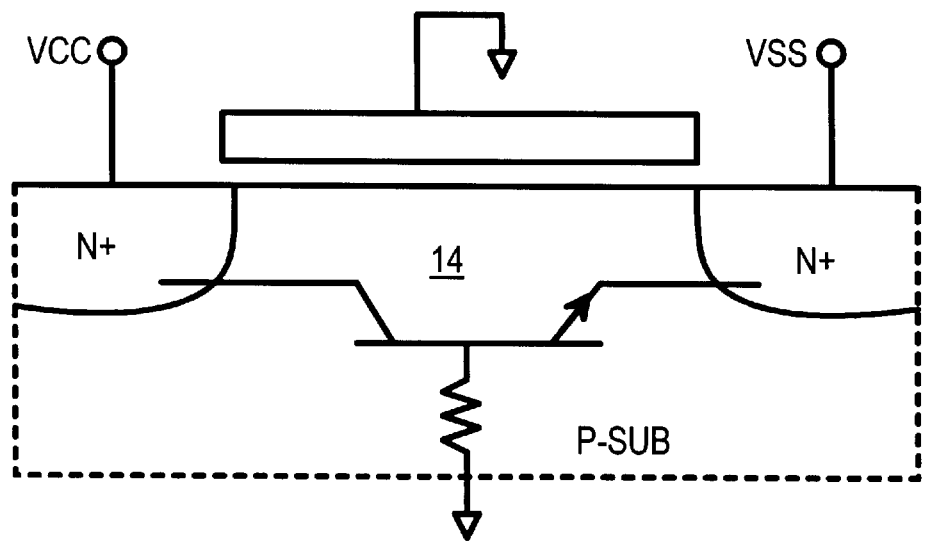
FIG. 2 shows the lateral NPN transistors in n-channel transistor 14.
Figure 3:
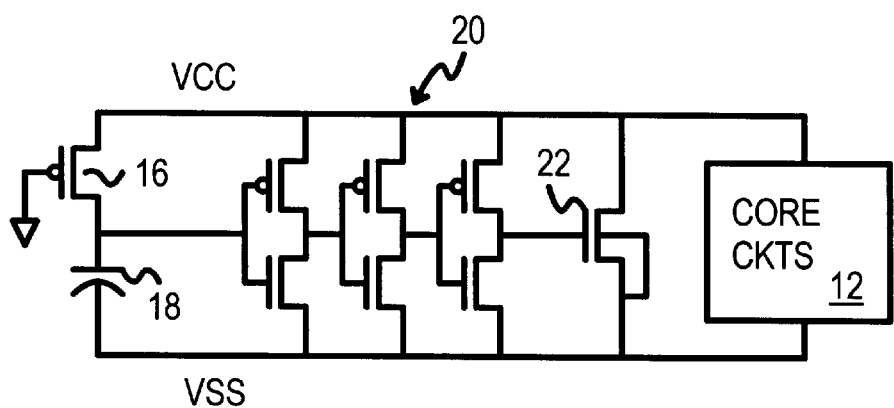
FIG. 3 shows an active clamp with an R-C sense for ESD protection.

Since the gate of clamp transistor 30 is actively driven high by inverter 38 during an ESD pulse, a conducting channel is formed under the gate of clamp transistor 30. This channel conducts the current from the drain to the source of clamp transistor 30. Thus standard metal-oxide-semiconductor (MOS) channel conduction shunts the ESD pulse, rather than the lateral NPN transistor as in the grounded-gate transistor of FIG. 1B.

Since transistors are designed for their channel length, and not their parasitic properties, a better-controlled clamp results.

Resistors 24, 25 form a voltage divider that depends on the voltage of Vcc. The resistance value of resistor 25 is significantly higher than that of resistor 24, so that the mid-point voltage of node S is much lower than the switching threshold of first inverter 32. For normal Vcc voltages, the voltage of node S is too low to switch first inverter 32. Instead, first inverter 32 recognizes the voltage of node S to be a logic low. First inverter 32 then outputs a high to node S0. Second inverter 34 inverts the high to produce a low on node S1, while third inverter 36 inverts node S1 to produce a high on node S2. Final inverter 38 then inverts the high on node S2 to produce a low on node S3, the gate of clamp transistor 30. Thus clamp transistor 30 is turned off for normal Vcc voltages.

When an ESD pulse is applied to Vcc, a large voltage is divided by resistors 24, 25. The large Vcc voltage causes the mid-point voltage at node S to rise above the switching threshold of first inverter 32. Thus first inverter 32 switches its output and drives node S0 low. Inverter 34 then drives node S1 high, inverter 36 drives node S2 low, and final inverter 38 drives node S high. The high voltage on node S turns on clamp transistor 30. Clamp transistor 30 turns on quickly, since it turns on once the gate-to-source voltage rises above the transistor threshold, which is typically only 0.7 volt.

Extender transistor 39 is an n-channel transistor than connects node S2 to ground when gate node S3 is high and clamp transistor 30 is discharging the ESD pulse. The gate of extender transistor 39 is connected to node S3, providing positive feedback. Extender transistor 39 extends the discharge time that clamp transistor 30 is on during an ESD event. The extended discharge time more fully discharges the ESD pulse, resulting in more complete protection of core circuitry 12.

Negative feedback is provided by hysteresis transistor 28. Hysteresis transistor 28 is a p-channel transistor with its gate controlled by node S1, and pulls node S0 up to Vcc. During normal operation and normal Vcc voltages, node S0 is high and node S1 is low. Thus hysteresis transistor 28 is on during normal Vcc voltages. When Vcc rises during an ESD event, first inverter 32 switches, driving node S0 low. However, hysteresis transistor 28 is still on, continuing to drive node S0 high. This delays the switching of node S0 until first inverter 32 has almost fully turned on. Eventually, first inverter 32 is able to overcome the drive from hysteresis transistor 28 and drive node S0 low. Then second inverter 34 drives node S1 high, turning off hysteresis transistor 28.

Hysteresis transistor 28 prevents noise from propagating through inverters 34, 36, 38 to turn on clamp transistor 30. Thus further noise immunity is provided.

Filter transistors 26, 27 have their sources and drains connected together and act as capacitors. The equivalent capacitors of filter transistors 26, 27 must be charged up by current through resistor 24 before node S rises enough to switch first inverter 32. Thus short-duration noise pulses on Vcc are prevented from falsely triggering clamp transistor 30.

Figure 5:
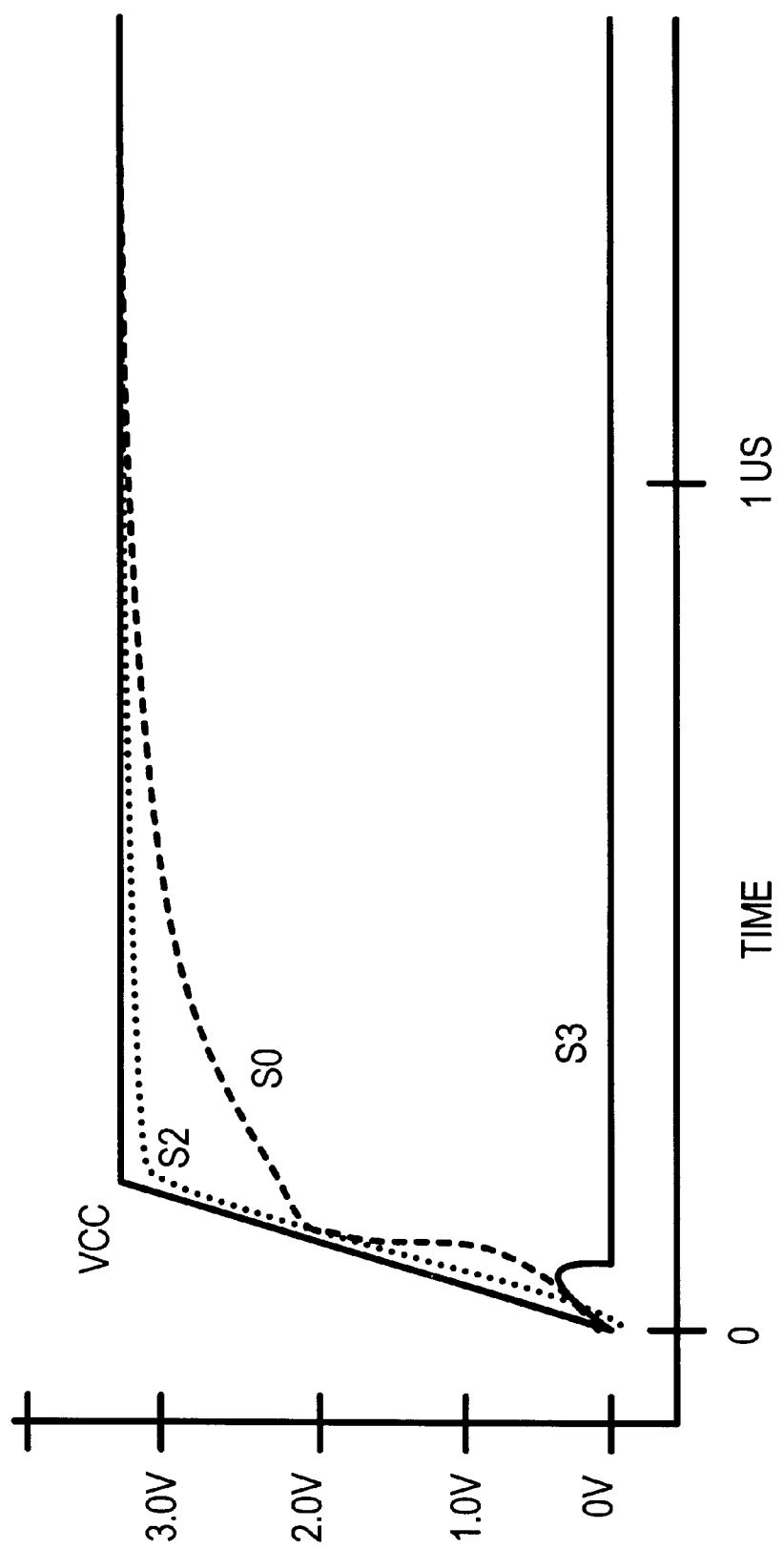
FIG. 5 shows a waveform of the active ESD-protection circuit during power-up.

FIG. 5 shows a waveform of the active ESD-protection circuit during power-up. When the chip containing the ESD-protection circuit is powered up to a normal Vcc of about 3 volts, the gate of clamp transistor 30, node S3, initially rises somewhat, but is quickly pulled back to ground as Vcc rises above the transistor threshold voltage of about 0.7 volt.

For low Vcc voltages, node S0 is first pulled up by the hysteresis transistor, since its gate, node S1, is initially low. As the rising Vcc voltage is divided by the resistors, node S is recognized as a low by the first inverter, which drives node S0 high. Node S2 is pulled high more rapidly than node S0, because transistor 39 is typically a weak pull down while inverter 36 has a stronger pull-up.

Thus node S3, the gate of the clamp transistor, never rises above 0.5 volt during the power-supply ramp. Since the transistor threshold is about 0.8 volt, the clamp transistor never has a chance to turn on.

ADVANTAGES OF THE INVENTION

An active circuit provides more accurate and controllable electro-static-discharge (ESD) protection of core circuitry. The active ESD-protection circuit can be quite sensitive to noise on the power supply. Such noise commonly occurs at power up. Thus active ESD-protection circuits includes special circuitry for noise immunity at power-up.

The thin-oxide transistor provides the best protection for other thin-oxide transistors on the chip. Thus the ESD switch is constructed from a standard thin-oxide transistor rather than a thick field-oxide transistor. The transistor characteristics of the thin-oxide ESD switch then better match the transistors being protected. A thick field oxide transistor would take much more time to turn on. Thus the thin-oxide ESD switch transistor turns on quickly, quickly dissipating the ESD pulse. This quick turn-on provides better ESD protection.

ALTERNATE EMBODIMENTS

Several other embodiments are contemplated by the inventors. For example other implementations of the capacitors and resistors are possible in different process technologies. Longer strings of inverters can be substituted, or more complex gates other than inverters can be used. R-C elements can be added to various nodes, such as nodes within the inverter chain. Other transistor technologies may be substituted. Additional filtering or more complex filters may be used. Resistors and capacitors can be implemented in a variety of ways, and can be located under the bonding-pad metal to minimize area.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:
1. A protection circuit comprising:
  a clamping transistor, coupled to shunt current from an electro-static-discharge (ESD) pulse, having a control gate;
  a voltage divider, coupled to the ESD pulse, for generating a divided voltage being a predetermined fraction of a voltage of the ESD pulse;
  a chain of inverters, receiving the divided voltage, for driving the control gate of the clamping transistor; and
  an extending transistor, for driving an extended internal node in the chain of inverters, having a gate receiving a feedback voltage from another internal node in the chain of inverters after the extended internal node;
  whereby the extending transistor extends a discharge time that the clamping transistor is shunting current during the ESD pulse.

2. The protection circuit of claim 1 further comprising:
  a hysteresis transistor, coupled to drive an output of an inverter in the chain of inverters, for increasing a divided voltage required to turn on the control gate of the clamping transistor,
  whereby a higher turn-on voltage is required.

3. The protection circuit of claim 2 wherein the hysteresis transistor is a transistor that couples a first internal node in the chain of inverters to a power supply, the hysteresis transistor having a gate coupled to a second internal node after the first internal node, the second internal node being driven by an inverter that has the first internal node as an input,
  whereby hysteresis is provided by coupling to the power supply.

4. The protection circuit of claim 3 wherein the hysteresis transistor is a p-channel transistor.

5. The protection circuit of claim 4 wherein the clamping transistor is an n-channel transistor.

6. The protection circuit of claim 5 wherein the clamping transistor has a drain coupled to a power supply, and a source coupled to a ground,
  whereby the clamping transistor shunts current from power to ground when the ESD pulse is applied from a power pin to a ground pin.

7. The protection circuit of claim 6 wherein the extending transistor is an n-channel transistor coupled between the extended internal node and the ground.

8. The protection circuit of claim 7 wherein the extending transistor has a gate coupled to the control gate of the clamping transistor,
  whereby the extending transistor and the clamping transistor share a common gate node.

9. The protection circuit of claim 8 wherein the chain of inverters includes a first inverter that receives the divided voltage from the voltage divider to output the first internal node, a second inverter that receives the first internal node and outputs the second internal node, a third inverter that receives the second internal node and outputs the extended internal node, and a fourth inverter that receives the extended internal node and drives the control gate of the clamping transistor,
  whereby four inverters are in the chain of inverters.

10. The protection circuit of claim 8 further comprising:

filter capacitors, coupled to the voltage divider, for capacitivly coupling the divided voltage to the ground and to the power supply, whereby the divided voltage is capacitivly coupled to the power supply and to the ground.

11. The protection circuit of claim 10 wherein the voltage divider comprises two resistors in series.

12. A Vcc-to-Vss electro-static-discharge (ESD) protection circuit comprising:

a Vcc power supply;

a Vss ground supply;

a voltage divider coupled between the Vcc power supply and the Vss ground supply, for generating a divided voltage on a sense node;

a chain of inverters, receiving the divided voltage, for generating a control node, the chain of inverters having an extended node;

a clamping transistor, having a channel for conducting current from the Vcc power supply to the Vss ground supply in response to the control node; and an extending transistor, having a channel for conducting current from the extended node to the Vss ground supply in response to a feedback voltage, the feedback voltage having an opposite logic state as the extended node, whereby the extending transistor uses the feedback voltage to extend discharge through the clamping transistor.

13. The Vcc-to-Vss ESD protection circuit of claim 12 wherein the chain of inverters comprises an even number of inverting stages.

14. The Vcc-to-Vss ESD protection circuit of claim 13 wherein the clamping transistor and the extending transistor are n-channel metal-oxide-semiconductor (MOS) transistors.

15. The Vcc-to-Vss ESD protection circuit of claim 12 wherein the feedback voltage is a voltage of the control node, whereby the control node is fed back to the extending transistor.

16. Vcc-to-Vss ESD protection circuit of claim 12 wherein the chain of inverters comprises:

a first inverter, receiving the divided voltage, for outputting a second node;

a second inverter, receiving the second node, for driving a third node;

a third inverter, receiving the third node, for driving the extended node;

a fourth inverter, receiving the extended node, for driving the control node.

17. Vcc-to-Vss ESD protection circuit of claim 16 further comprising:

a hysteresis transistor, having a gate coupled to the third node, for conducting current from the Vcc power supply to the second node;

wherein a switching threshold of the first inverter is increased by the hysteresis transistor, whereby noise immunity is increased by the hysteresis transistor.

18. A core protection device for protecting core transistors from electro-static-discharge (ESD) pulses comprising:

a clamping n-channel transistor, having a drain coupled to a power supply bus, a source coupled to a ground bus, and a gate coupled to a control node, for shunting current during ESD pulses;

a final inverter receiving an extended node, for outputting the control node;

an extending n-channel transistor, having a drain coupled to the extended node, a source coupled to the ground bus, and a gate coupled to the control node, for extending discharge time when the clamping n-channel transistor is turned on during the ESD pulses;

at least one inverter, receiving a third node, for outputting to the extended node;

a second inverter, receiving a second node, for outputting the third node;

a first inverter, receiving a first node, for outputting the second node;

a first resistor, coupled between the power supply bus and the first node; and a second resistor, coupled between the first node and the ground bus;

the first and second resistors for generating a sense voltage on the first node, the sense voltage being proportional to a voltage between the power supply bus and the ground bus;

wherein a switching threshold of the first inverter is lower than the sense voltage when the voltage between the power supply bus and the ground bus is within a normal operating range, the clamping n-channel transistor being turned off;

wherein when the voltage between the power supply bus and the ground bus is above the normal operating range during an ESD pulse, the sense voltage exceeds the switching threshold, and the clamping n-channel transistor is turned on, whereby discharge time is extended by the extending n-channel transistor.

19. The core protection device of claim 18 further comprising:

a hysteresis p-channel transistor, having a drain coupled to the second node, a source coupled to the power supply bus, and a gate coupled to the third node, for raising the switching threshold of the first inverter when the sense voltage is rising, whereby the switching threshold is raised for rising sense voltages to provide noise suppression.

20. The core protection device of claim 19 further comprising:

a first filter capacitor, coupled between the power supply bus and the first node;

a second filter capacitor, coupled between the first node and the ground bus, whereby the sense voltage is filtered.

* * * * *